United States Patent
Tanaka

(10) Patent No.: US 6,687,276 B2
(45) Date of Patent: Feb. 3, 2004

(54) SURFACE EMITTING SEMICONDUCTOR LASER

(75) Inventor: Akira Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 70 days.

(21) Appl. No.: 09/992,990

(22) Filed: Nov. 5, 2001

(65) Prior Publication Data

US 2002/0061043 A1 May 23, 2002

(30) Foreign Application Priority Data

Nov. 20, 2000 (JP) ..................................... P2000-353113

(51) Int. Cl.$^7$ ................................................. H01S 5/00
(52) U.S. Cl. .......................................... 372/46; 372/45
(58) Field of Search ............................. 372/45, 50, 46; 257/14, 13, 15

(56) References Cited

U.S. PATENT DOCUMENTS

| | | | |
|---|---|---|---|
| 5,299,216 A | * 3/1994 | van der Poel et al. | 257/14 |
| 5,351,256 A | * 9/1994 | Schneider et al. | 372/45 |
| 5,689,358 A | * 11/1997 | Nakao et al. | 257/13 |
| 5,877,038 A | 3/1999 | Coldren et al. | |
| 5,923,696 A | * 7/1999 | Ramdani et al. | 372/50 |
| 5,960,018 A | * 9/1999 | Jewell et al. | 257/15 |
| 6,008,067 A | 12/1999 | Ramdani et al. | |
| 6,015,980 A | 1/2000 | Bowers et al. | |
| 6,292,502 B1 | * 9/2001 | Shimada | 372/45 |

FOREIGN PATENT DOCUMENTS

| | | |
|---|---|---|
| EP | 1 045 457 | 10/2000 |
| JP | 05-090702 | 4/1993 |
| JP | 06-097586 | 4/1994 |
| JP | 06237041 | * 8/1994 ... 372/44 |
| JP | 10-335742 | 12/1998 |

OTHER PUBLICATIONS

Jalonen, et al. "Oxide–Confined Resonant Cavity Red Light–Emitting Diode Grown by Solid Source Molecular Beam Epitaxy" Electronics Letters Nov. 6, 1997 vol. 33 No. 23.

Smowton, et al. "Invited Paper Role of Sublinear Gain–Current Relationship in Compressive and Tensile Strained 630nm GaInP Lasers" International Journal of Optoelectronics, 1995, vol. 10, No. 5, pp. 383–391.

Gauggel, et al. "Fabrication and Operation of First–Order GaInP/AlGaInP DFB Lasers at Room Temperature" Electronics Letters Mar. 2, 1995 vol. 31 No. 5 pp. 367–368.

Schneider, et al. "MOVPE Growth of InAlGaP–Based Visible Vertical–Cavity Surface–Emitting Lasers" Journal of Crystal Growth 124 (1993) 763–771.

U.S. patent application No. 09/639,018 filed Aug. 15, 2001 by Koichi GEN–El et al.

* cited by examiner

Primary Examiner—Paul Ip
Assistant Examiner—Hung T Vy
(74) Attorney, Agent, or Firm—Hogan & Hartson, LLP

(57) ABSTRACT

A surface emitting semiconductor laser capable of improving high temperature properties is provided. In a surface emitting semiconductor laser, as well width of an active layer is set at from 4 nm to 6 nm and the number of wells thereof is set at one or two In addition, above and below the active layer, InGaAlP clad layers are formed, and in a stacking direction of the active layer, through the above and below clad layers each, further above and below thereof, light reflecting layers are formed.

18 Claims, 10 Drawing Sheets

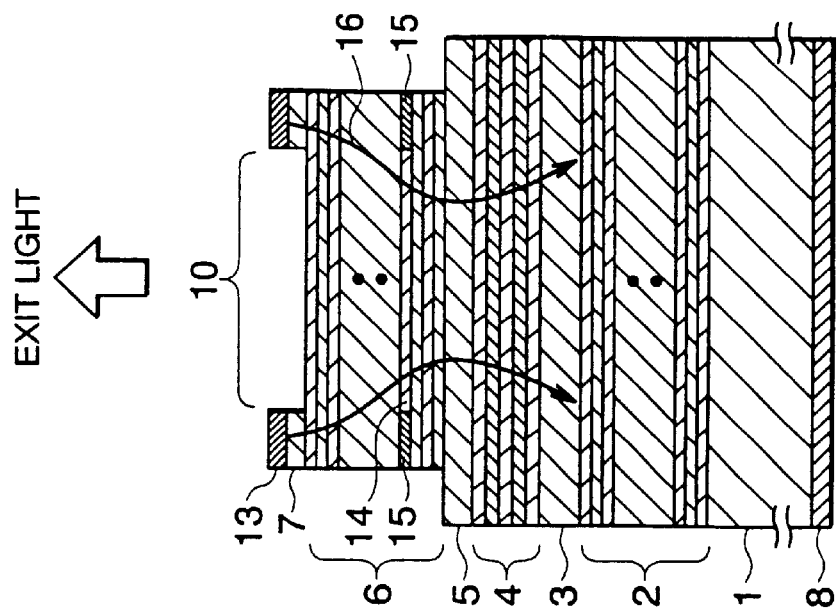
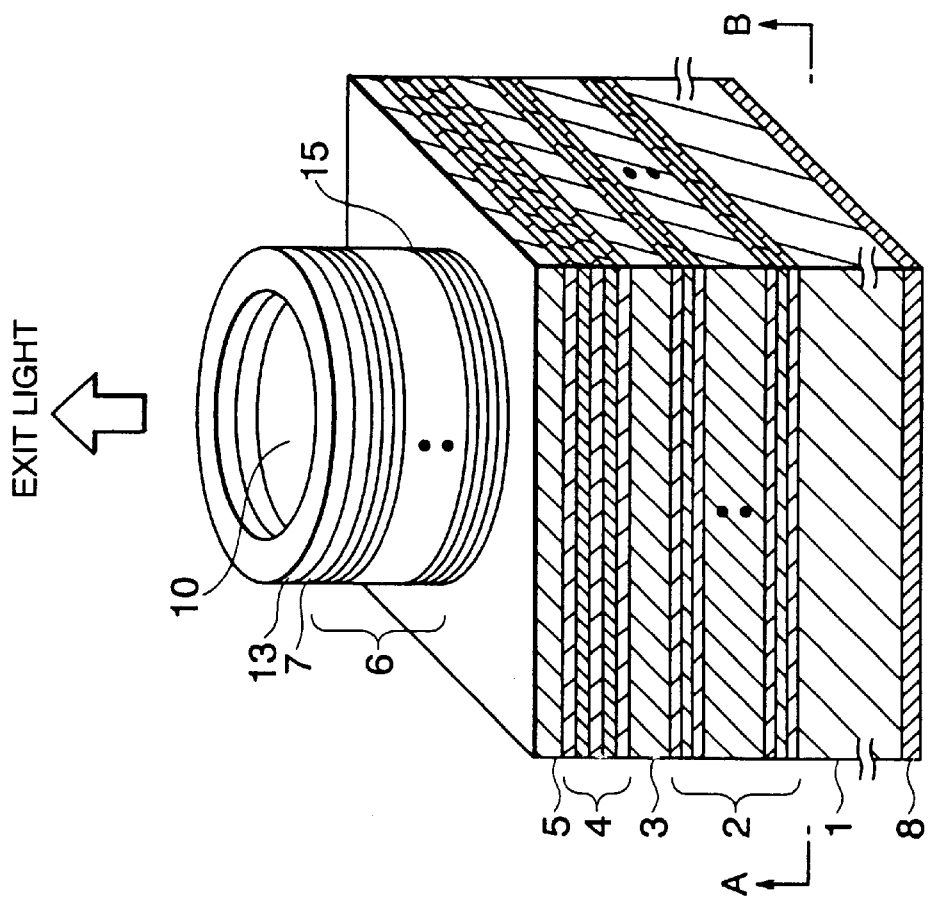
FIG. 4B
FIG. 4A

SURFACE EMITTING SEMICONDUCTOR LASER

CROSS REFERENCE TO RELATED APPLICATIONS

This application is based upon and claims the benefit of priority from the prior Japanese Patent Application No. 2000-353113, filed on Nov. 20, 2000; the entire contents of which are incorporated herein by reference.

BACKGROUND

1. Field of the Invention

The present invention relates to a surface emitting semiconductor laser, and is suitably applicable particularly to an InGaAlP quantum well structure surface emitting semiconductor laser.

2. Description of the Related Art

Recently, a semiconductor laser emitting in the range of wavelengths from 600 to 700 nm has been put into practical use in a field such as DVD (digital versatile disk) or the like.

Meanwhile, a surface emitting semiconductor laser, if being put into practical use in this wavelength region, will be used as a light source for a high speed plastic fiber link. As a surface emitting semiconductor laser realizing such wavelength region, there is an InGaAlP surface emitting semiconductor laser. In order to lower a threshold current of the InGaAlP surface emitting semiconductor laser, there is a surface emitting semiconductor laser in which active layer a quantum well structure is adopted.

FIG. 10A is a perspective view showing a configuration of an existing InGaAlP quantum well surface emitting semiconductor laser. In FIG. 10A, on an n-GaAs substrate 1, there are stacked in turn a DBR (Distributed Bragg Reflector) multi-layer film 2, an n-InGaAlP clad layer 3, an MQW (Multiple Quantum Well) active layer 4, a p-InGaAlP clad layer 5, a DBR multi-layer film 6, and a p-GaAs cap layer 7. On a back surface of the n-GaAs substrate 1, there is formed an n-side electrode 8, on the p-GaAs cap layer 7 there being formed a p-side electrode 9. In the p-GaAs cap layer 7 and the p-side electrode 9, there is formed a disk like opening to form a light exit window 10 for taking out emitted light.

The active layer 4 is formed of $In_{0.5}Ga_{0.5}P/In_{0.5}(Ga_{0.5}Al_{0.5})_{0.5}P$ film; the clad layer 3 being formed of an n-$In_{0.5}(Ga_{0.3}Al_{0.7})_{0.5}P$ film; the clad layer 5 being formed of a p-$In_{0.5}(Ga_{0.3}Al_{0.7})_{0.5}P$ film; the DBR multi-layer film 2 being formed of an n-$Ga_{0.5}Al_{0.5}As/Ga_{0.05}Al_{0.95}As$ film; the DBR multi-layer film 6 being formed of a p-$Ga_{0.5}Al_{0.5}As/Ga_{0.05}Al_{0.95}As$ film.

Furthermore, the active layer 4 and the clad layers 3 and 5 form a resonator of the surface emitting semiconductor laser, and at the active layer 4 in the center a film thickness is designed to be an antinode of a standing wave of one wavelength.

FIG. 10B is an enlargement of a portion of the active layer and the clad layers in FIG. 10A. In FIG. 10B, the MQW active layer 4, which is formed by repeating to alternately stack an $In_{0.5}(Ga_{0.5}Al_{0.5})_{0.5}P$ film 4a and an $In_{0.5}Ga_{0.5}P$ film 4b, is sandwiched by the clad layers 3 and 5 to form a double heterostructure junction.

FIG. 10C is an energy band diagram of a portion of the active layer 4 and the clad layers 3 and 5. In FIG. 10C, the $In_{0.5}Ga_{0.5}P$ films 4b being smaller in their band gaps in comparison with the $In_{0.5}(Ga_{0.5}Al_{0.5})_{0.5}P$ films 4a, there are formed quantum wells QW at the portion of the $In_{0.5}Ga_{0.5}P$ films 4b. In the quantum wells QW, energy levels are quantized, and thereby energy levels of electrons injected into the active layer 4 may be localized. As a result, the laser may be efficiently oscillated, the threshold current being lowered.

In addition, the clad layers 3 and 5, which are formed of the n-$In_{0.5}(Ga_{0.3}Al_{0.7})_{0.5}P$ film, are larger in their band gaps than those of the $In_{0.5}Ga_{0.5}P/In_{0.5}(Ga_{0.5}Al_{0.5})_{0.5}P$ films. As a result, electrons and holes injected through the clad layers 3 and 5 may be confined inside the active layer 4, the laser being efficiently oscillated.

In the existing MQW structure surface emitting semiconductor laser, in order to enhance a gain, it is general to set a well width Hb at 7 nm or more and the number of wells Wn at five or more. However, in the active layer 4 adopting the MQW structure, when the well width is 7 nm or more and the number of the wells is five or more, heat generation from the active layer 4 becomes larger, resulting in deterioration of high temperature properties.

The object of the present invention is to provide a surface emitting semiconductor laser capable of improving the high temperature properties.

SUMMARY

A surface emitting semiconductor laser according to an embodiment of the present invention includes an active layer having an InGaAlP quantum well structure of which well width is from 4 nm to 6 nm and of which number of wells is one or two, InGaAlP clad layers formed above and below the active layer, and light reflecting layers formed, in a stacking direction of the active layer, further above and below the clad layers through the respective clad layers.

BRIEF DESCRIPTION OF THE DRAWINGS

The invention is described with reference to the drawings, which are presented for the purpose of illustration only and are in no way limiting of the invention.

FIG. 4A is a perspective view showing a configuration of a surface emitting semiconductor laser involving a third embodiment of the present invention;

FIG. 4B is a sectional view cut along an A-B profile of FIG. 4A.

DETAILED DESCRIPTION (Explanation of Embodiments)

Figure 1:
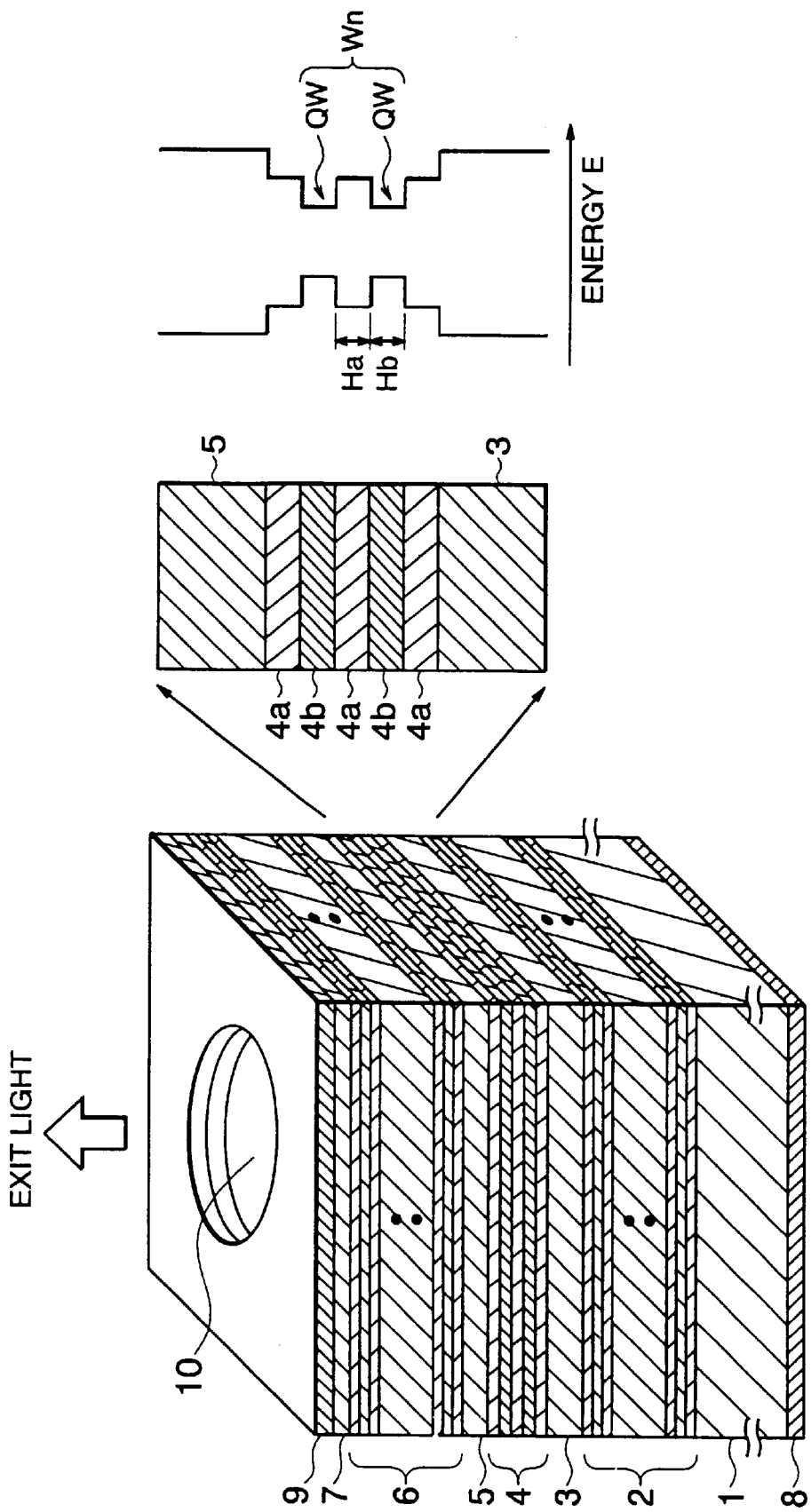
FIG. 1A is a perspective view showing a configuration of a surface emitting semiconductor laser involving a first embodiment of the present invention.
FIG. 1B is an enlargement of a portion of the active layer and clad layers shown in FIG. 1A.
FIG. 1C is an energy band diagram of the active layer and clad layers shown in FIG. 1B.

The present invention, while securing a gain, enables to make thinner the thickness of the active layer and to suppress heat generation from the active layer. As a result, an increase of the threshold current at the high temperature operation may be suppressed from occurring, thereby the high temperature properties being improved.

In one embodiment of the present invention, as the clad layers, an $In_{0.5}(Ga_{1-x}Al_x)_{0.5}P$ film (herein, $x \geq 0.8$) may be cited. Therewith, current confinement in the active layer may be improved, resulting in enabling to lower the threshold current, thereby an improvement of the high temperature properties being attained.

In another embodiment of the present invention, the light reflecting layer is the DBR multi-layer film where a $Ga_{1-x}Al_xAs$ film (herein, $0.9 \geq x \geq 0.5$) and a $Ga_{1-y}Al_yAs$ film (herein, $y \geq 0.9$) are repeatedly stacked in turn. Thereby, light loss in the light reflecting layer may be decreased, the threshold current being lowered and the high temperature properties being improved. Furthermore, the light reflecting film is formed continuously with the active layer and the clad layers in the same furnace. That is, the light reflecting layer may be formed without exposing to an ambient atmosphere. Accordingly, the light reflecting layer may be improved in its quality and fabricating processes thereof may be simplified.

In addition, as still another embodiment of the present invention, the light reflecting layer is the DBR multi-layer film where an $In_{0.5}(Ga_{1-x}Al_x)_{0.5}P$ film (herein, $x \leq 0.5$) and an $In_{0.5}(Ga_{1-y}Al_y)_{0.5}P$ film (herein, $y \geq 0.9$) are repeatedly stacked in turn. Thereby, the light reflecting layer may be formed of the material of the same system with the active layer and the clad layers. Accordingly, the light reflecting layer of low loss may be formed with ease.

As another embodiment of the present invention, the light exit window of laser light that is exited transmitting through one of the above and below light reflecting layers is arranged in array on the substrate. Thereby, it needs only to pattern the light exit window to integrate a plurality of semiconductor lasers on the same substrate. Accordingly, application to a multi-link and so on may be implemented with ease.

As still another embodiment of the present invention, the DBR multi-layer film includes a circular high resistance region. A current supplied to the active layer due to the circular high resistance region may be blocked and confined, thereby light emission efficiency being improved and the threshold current being lowered.

As another embodiment of the present invention, the DBR multi-layer film includes therein an AlAs layer, the AlAs layer being circularly surrounded by an oxide region of AlAs. Due to the circular oxide region, the current supplied to the active layer may be blocked and confined, thereby light emission efficiency being improved and the threshold current being lowered.

Furthermore, as another embodiment of the present invention, on a side, different from the aforementioned clad layer side, of one of the light reflecting layers that are the DBR multi-layer films, an electrode layer transmitting the output laser light is provided. Thereby, the current may be smoothly supplied from the electrode layer.

Furthermore, as still another embodiment of the present invention, on a side, different from the aforementioned clad layer side, of one of the light reflecting layers that are the DBR multi-layers, a substrate is provided, the substrate being hollowed to form the light exit window. In that case, a side opposite to the substrate may be made a mounting face, thereby, a distance from the mounting face to the active layer becoming shorter, resulting in an improvement of heat dissipation characteristics.

As another embodiment of the present invention, the DBR multi-layer is circularly surrounded by a buried layer. The current supplied to the active layer may be blocked and confined by the circularly buried layer, thereby light emission efficiency being improved and the threshold current being lowered.

Furthermore, as another embodiment of the present invention, the upper and lower DBR multi-layer films each that are the above and below light reflecting layers include therein an AlAs layer, the AlAs layer being circularly surrounded by an oxide region of AlAs. Here, in place of AlAs, InAs may be used. Thereby, due to the circular oxide region, the current supplied to the active layer may be blocked and confined above and below the active layer, thereby, furthermore, light emission efficiency being improved and the threshold current being lowered.

In the following, the surface emitting semiconductor laser involving the aforementioned embodiments will be explained with reference to the drawings.

FIG. 1A is a perspective view showing a configuration of a surface emitting semiconductor laser involving a first embodiment of the present invention. In FIG. 1A, on an n-GaAs substrate 1, a DBR multi-layer film 2, an n-InGaAlP clad layer 3, an MQW active layer 4, a p-InGaAlP clad layer 5, a DBR multi-layer film 6, and a p-GaAs cap layer 7 are stacked in turn.

The active layer 4 and the clad layers 3 and 5 form a resonator of the surface emitting semiconductor laser, at the active layer 4 in the center thereof a film thickness being designed to be an antinode of a standing wave of one wavelength.

The formation of these films may be implemented by means of for instance MOCVD (Metal-Organic Chemical Vapor Deposition), MBE (Molecular Beam Epitaxy), or ALE (Atomic Layer Epitaxy).

In addition, on the back-face of the n-GaAs substrate 1, an n-side electrode 8 is formed, and on the p-GaAs cap layer 7, the p-side electrode 9 is formed. Furthermore, there is formed a disc-like opening in the p-GaAs cap layer 7 and the p-side electrode 9 to form the light exit window 10 for taking out exit light. The p-GaAs cap layer 7 and the p-side electrode 9, by use of photoresist formed by means of photolithography as a mask, are selectively etched out to form light exit window 10.

The active layer 4 is formed of for instance an $In_{0.5}Ga_{0.5}P/In_{0.5}(Ga_{0.5}Al_{0.5})_{0.5}P$ film; the clad layer 3 being formed of for instance an $n-In_{0.5}(Ga_{0.2}Al_{0.8})_{0.5}P$ film; the clad layer 5 being formed of for instance a $p-In_{0.5}(Ga_{0.2}Al_{0.8})_{0.5}P$ film.

Furthermore, the DBR multi-layer films 2 and 6, in which a film of high refractive index and a film of low refractive index are repeatedly stacked in turn, are preferable to be formed by repeatedly stacking a $Ga_{1-x}Al_xAs$ film (herein, $0.9 \geq x \geq 0.5$) and a $Ga_{1-y}Al_yAs$ film (herein, $y \geq 0.9$) in turn.

For instance, the DBR multi-layer film 2 may be formed of 54.5 pairs of $n-Ga_{0.5}Al_{0.5}As/Ga_{0.5}Al_{0.95}As$ films, the DBR multi-layer film 6 being formed of 34 pairs of $p-Ga_{0.5}Al_{0.5}As/Ga_{0.05}Al_{0.95}As$ films.

FIG. 1B is an enlargement of a portion of the active layer and the clad layers in FIG. 1A. As shown in FIG. 1B, in the MQW active layer 4, an $In_{0.5}(Ga_{0.5}Al_{0.5})_{0.5}P$ film 4a and an $In_{0.5}Ga_{0.5}P$ film 4b are repeated stacked in turn; as shown in FIG. 1C, in a portion of the $In_{0.5}Ga_{0.05}P$ film 4b, a quantum well QW is formed.

In the figure, the well width Hb is set in the range of from 4 nm to 6 nm, and the number of the wells Wn being set at one or two. A well spacing Ha is preferably set in the range of from approximately 3 to 10 nm.

The clad layers 3 and 5 are preferably formed of an $In_{0.5}(Ga_{1-x}Al_x)_{0.5}P$ film (herein, $x \geq 0.8$), being formed of an $n-In_{0.5}(Ga_{0.2}Al_{0.8})_{0.5}P$ film for instance.

Figure 2:
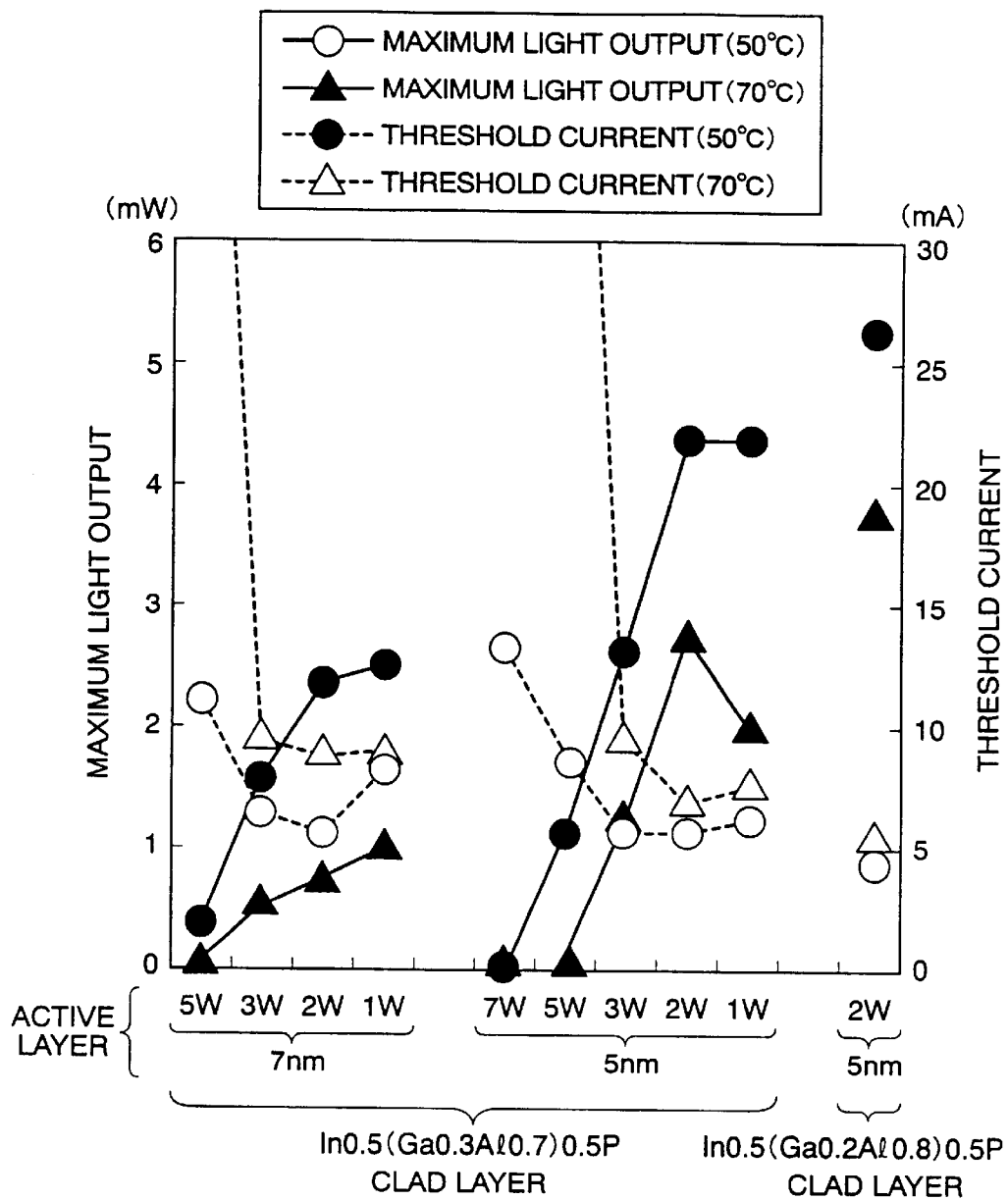
FIG. 2 is a diagram showing simulation results of the threshold current and the maximum light output when the number of the wells and the well width of the active layer and compositions of the clad layers involving the present embodiment are varied.

FIG. 2 is a diagram showing simulation results of the threshold current and the maximum light output when the number of the wells and the well width of the active layer and the composition of the clad layers involving the present embodiment are varied. In FIG. 2, in the case of the composition of the clad layers 3 and 5 being $In_{0.5}(Ga_{0.3}Al_{0.7})_{0.5}P$ and the well width Hb of the active layer 4 being 7 nm, as the number of the wells Wn is increased from one to five, the maximum light output decreases, in particular, when a temperature is elevated (from 50° C. to 70° C.), the maximum light output decreases. Furthermore, the threshold current, while approximately constant when the number of the wells Wn is increased from one to three, increases when the number of the wells Wn is increased from three to five, in particular, when the temperature is raised (from 50° C. to 70° C.), this tendency becomes remarkable.

Furthermore, in the case of the well width of the active layer Hb being 5 nm, when the number of the wells Wn is increased from one to two, the maximum light output once increases, thereafter, as the number of the wells is increased from two to seven, the maximum light output decreases. In particular, when the temperature is raised (from 50° C. to 70° C.), the maximum light output decreases. In addition, while the threshold current, in the case of the number of the wells Wn being from one to three, is approximately constant, when the number of the wells Wn is increased from three to seven, the threshold current increases, in particular, when the temperature is raised (from 50° C. to 70° C.), this tendency becomes conspicuous.

Furthermore, in the case of the composition of the clad layers 3 and 5 being changed from $In_{0.5}(Ga_{0.3}Al_{0.7})_{0.5}P$ to $In_{0.5}(Ga_{0.2}Al_{0.8})_{0.5}P$, when the case where the well width Hb of the active layer is 5 nm and the number of the wells Wn is two is taken for comparison purpose, at both temperatures of 50° C. and 70° C., the maximum light output increases and the threshold current becomes lower.

Accordingly, when the well width of the active layer 4 is from 4 nm to 6 nm and the number of the wells is from one to three, especially when one or two, even under high temperature operation, while suppressing the increase of the threshold current, the maximum light output may be suppressed from lowering.

Furthermore, by increasing the content of Al in the clad layers 3 and 5 to make the band gaps thereof larger, the current confinement in the active layer 4 may be improved. Thereby, the threshold current may be lowered and the maximum light output may be increased.

In the aforementioned embodiment, a case where the p-side electrode 9 is formed in the surroundings of the light exit window 10 is taken by way of illustration. However, a transparent electrode may be formed on the light exit window 10. Thereby, into the active layer 4 below the light exit window 10, the current may be efficiently injected to lower the threshold current.

Still furthermore, it is explained that, by increasing the content of Al in the clad layers 3 and 5 to make the band gaps thereof larger, the current in the active layer 4 may be effectively confined. However, by forming the clad layers 3 and 5 into a superlattice structure to form multi-quantum barrier (MQB) and thereby causing electrons tending to drain out of the active layer 4 to reflect resonantly, the band gaps of the clad layers 3 and 5 may be effectively increased. That is, the multi-quantum barrier (MQB) may be adopted.

Furthermore, in the active layer 4, a distorted quantum well structure may be introduced. Thereby, the threshold current may be lowered.

Furthermore, the active layer 4, other than the InGap/InGaAlP multi-layer film, may be an InGaAlP/InGaAlP multi-layer film.

Furthermore, the DBR multi-layer films 2 and 6, other than GaAlAs/GaAlAs multi-layer film, may be one formed by repeatedly stacking an $In_{0.5}(Ga_{1-x}Al_x)_{0.5}$ P film (herein, $x \leq 0.5$) and an $In_{0.5}(Ga_{1-y}Al_y)_{0.5}$ P film (herein, $y \geq 0.9$) in turn, thereby also, the reflecting film of low loss being formed with ease.

Figure 3B:
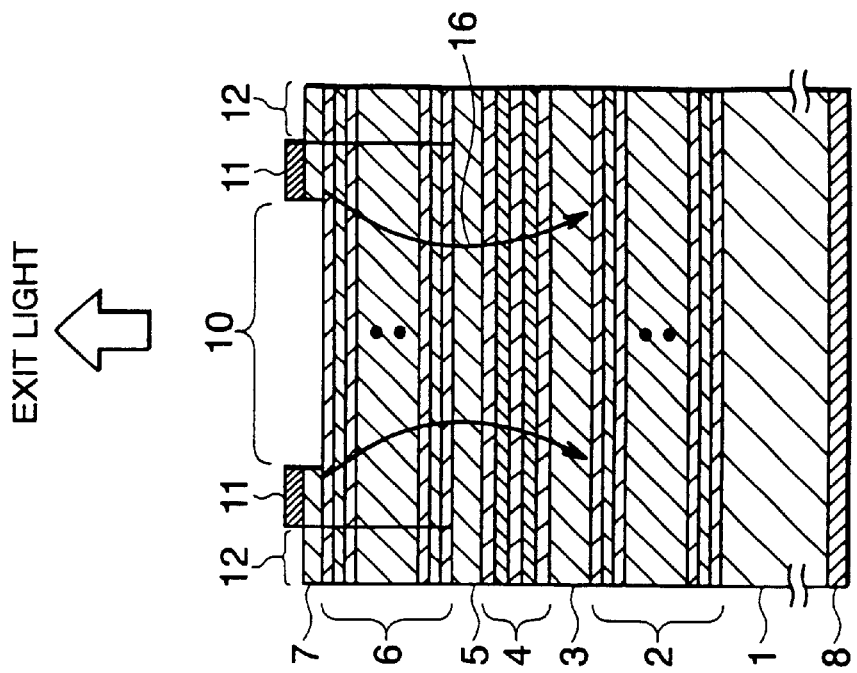
FIG. 3B is a sectional view cut along an A-B profile of FIG. 3A.
Figure 3A:
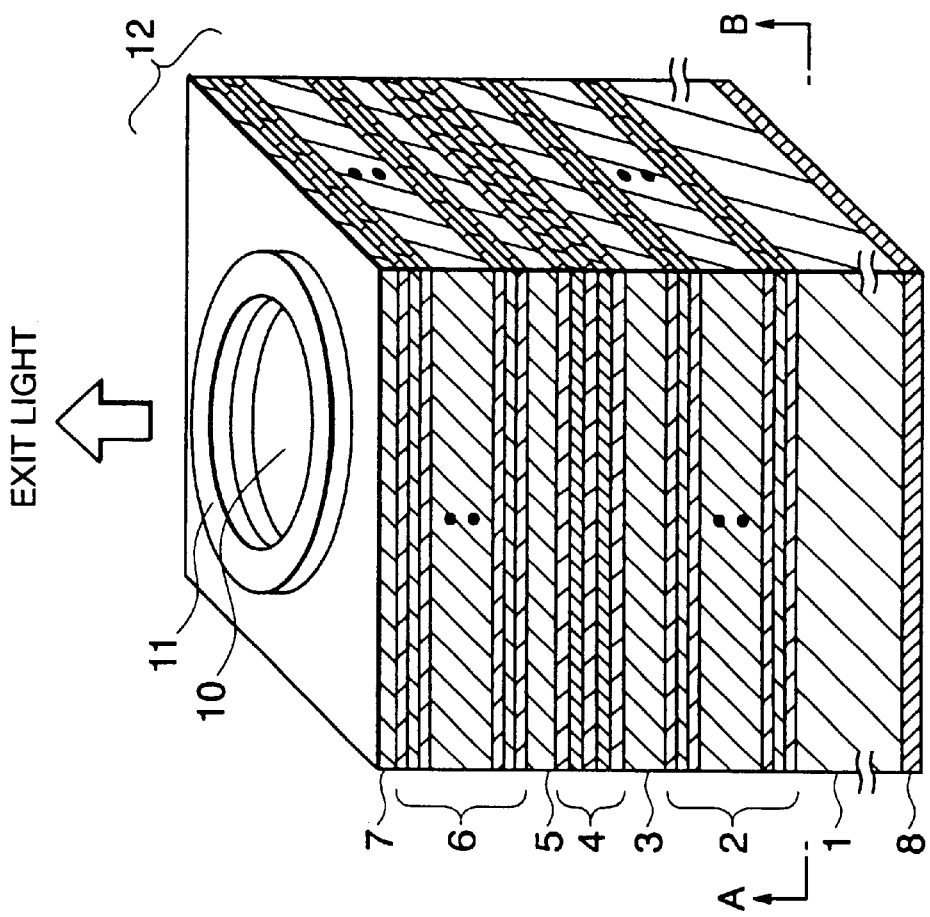
FIG. 3A is a perspective view showing a configuration of a surface emitting semiconductor laser involving a second embodiment of the present invention.

FIG. 3A is a perspective view showing a configuration of a surface emitting semiconductor laser involving the second embodiment of the present invention; FIG. 3B is a sectional view cut along an A-B profile of FIG. 3A. In FIGS. 3A and 3B, on the p-GaAs cap layer 7, the p-side ring electrode 11 is formed, by removing the p-GaAs cap layer 7 inside of the p-side ring electrode 11, the light exit window 10 being formed.

In addition, outside of the p-side ring electrode 11, extending to the p-GaAs cap layer 7 and the DBR multi-layer film 6, a high resistance region 12 is formed. The high resistance region 12 may be formed by selectively implanting ions such as protons to the outside of the p-side electrode 11, for instance.

The disposition of the high resistance region 12 enables to block and confine the current 16 supplied from the p-side ring electrode 11 at the portion of the high resistance region 12, thereby light emission efficiency being improved and the threshold current being lowered.

In the aforementioned embodiment, a method by which the high resistance region 12 is formed in the p-GaAs cap layer 7 and the DBR multi-layer film 6 is explained. However, the high resistance region 12 may be additionally formed inside the clad layer 5, thereby the current being further blocked.

FIG. 4A is a perspective view showing a configuration of a surface emitting semiconductor laser involving the third embodiment of the present invention; FIG. 4B is a sectional view cut along an A-B profile of FIG. 4A. In FIGS. 4A and 4B, the DBR multi-layer film 6 and the p-GaAs cap layer 7 are etched to be cylindrical. On the p-GaAs cap layer 7, a p-side ring electrode 13 is formed, and the p-GaAs cap layer 7 inside of the p-side ring electrode 13 is removed. Thereby, the light exit window 10 is formed.

Furthermore, one or a plurality of AlAs layers 14 is formed on any layers of the DBR multi-layer film 6. The AlAs layer 14 is exposed to an oxidizing atmosphere to oxidize a periphery portion of the AlAs layer 14. Thereby, a selectively oxidized ring-like region 15 may be formed inside the DBR multi-layer film 6.

By disposing the selectively oxidized region 15, the current 16 supplied from the p-side ring electrode 13 may be blocked and confined by the selectively oxidized region 15, thereby light emission efficiency being improved and the threshold current being lowered.

Figure 5:
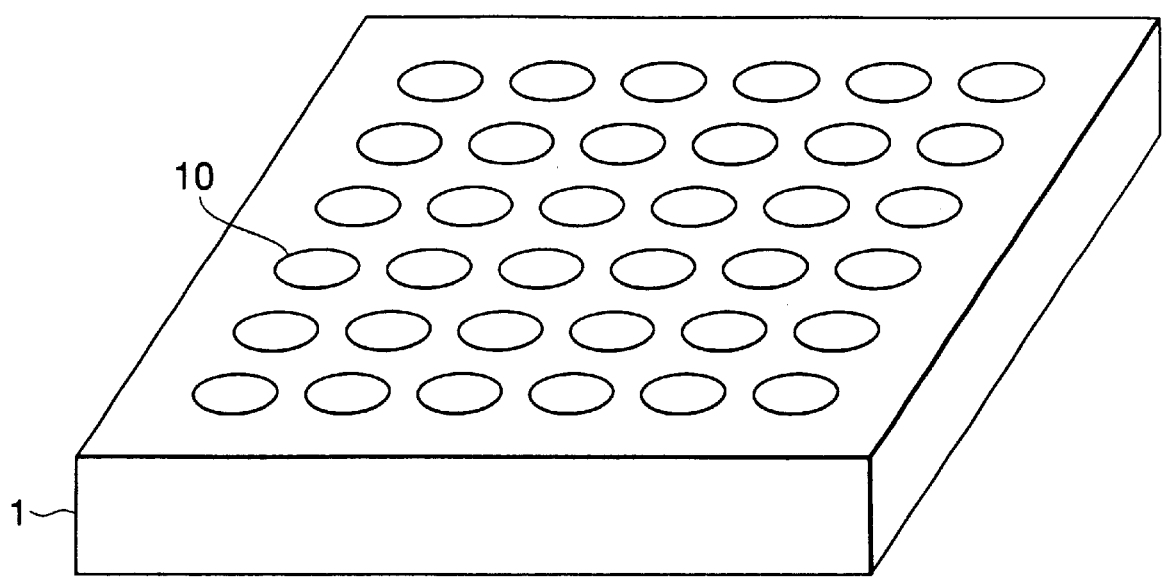
FIG. 5 is a perspective view showing a configuration of a surface emitting semiconductor laser involving a fourth embodiment of the present invention.

FIG. 5 is a perspective view showing a configuration of a surface emitting semiconductor laser involving the fourth embodiment of the present invention. In FIG. 5, on a single n-GaAs substrate 1, a plurality of light exit windows 10 is formed in array, from the light exit windows 10 each, light being separately and independently taken out. The array-like surface emitting semiconductor laser, by changing only the mask pattern, may be formed with ease. Accordingly, positioning between pellets each other and mounting processes may be eliminated when arranging the semiconductor laser in array, resulting in simplification of the fabricating process.

Furthermore, because the plurality of light exit windows 10 is formed on the single substrate, optical components such as optical fiber and lenses may be three-dimensionally mounted with ease, being easily applied to the multi-link or the like.

Figure 6A:
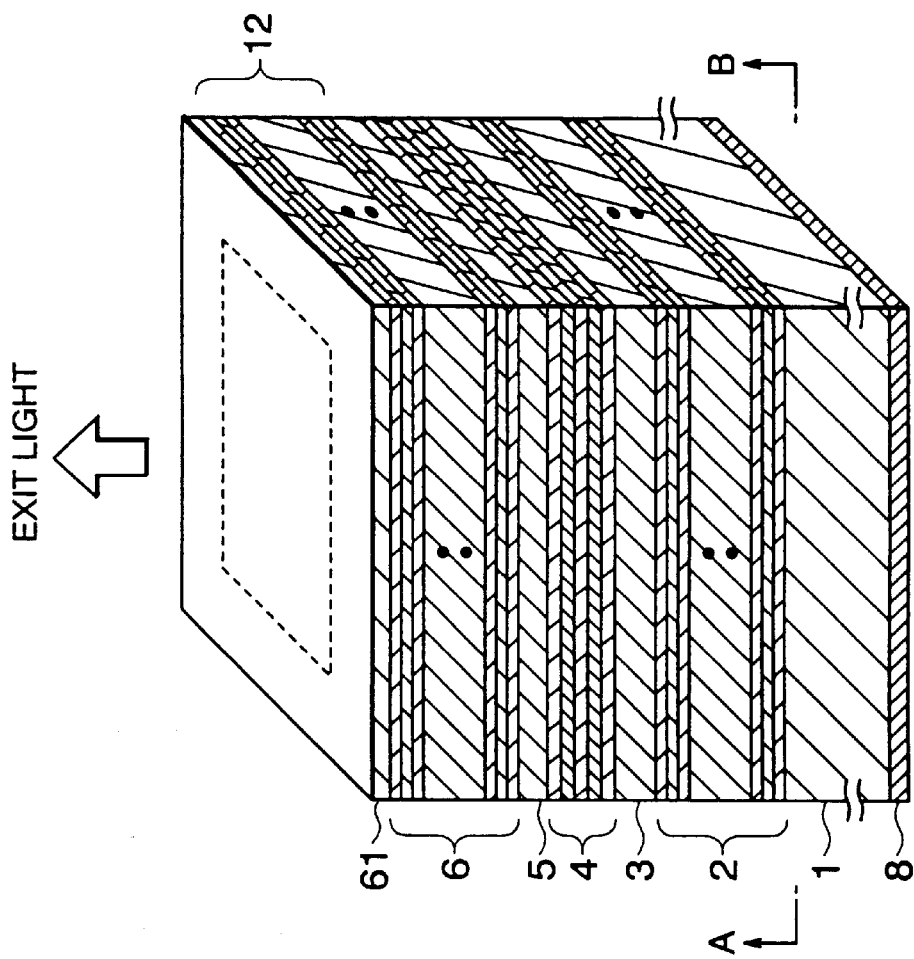
FIG. 6A is a perspective view showing a configuration of a surface emitting semiconductor laser involving a fifth embodiment of the present invention.
Figure 6B:
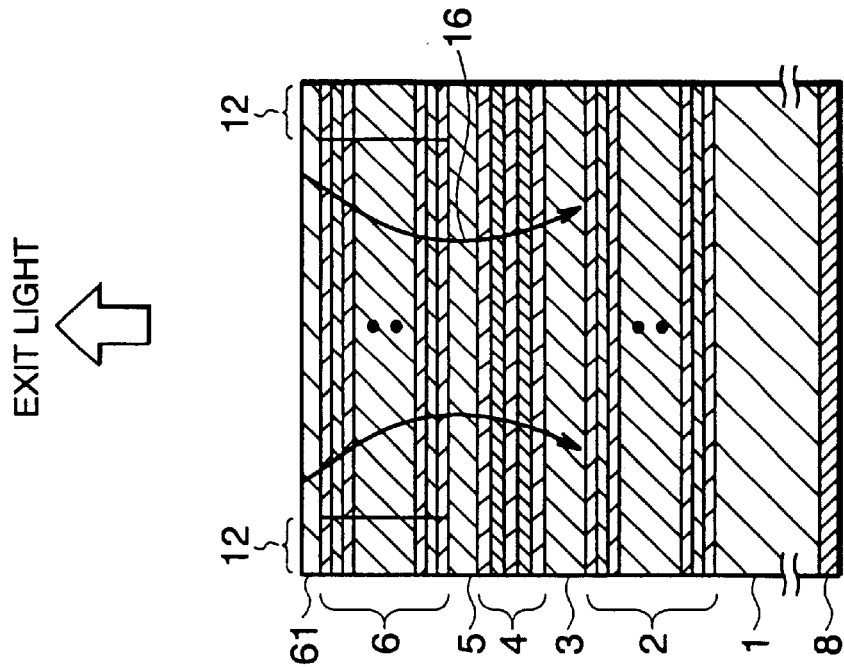
FIG. 6B is a sectional view cut along an A-B profile of FIG. 6A.

FIG. 6A is a perspective view showing a configuration of a surface emitting semiconductor laser involving the fifth embodiment of the present invention; FIG. 6B is a sectional view cut along an A-B profile in FIG. 6A. In FIGS. 6A and 6B, on the DBR multi-layer film 6, a transparent electrode 61 is formed. The transparent electrode 61, an ITO (Indium Tin Oxide) film for instance, is one high in transmittance in an wavelength from 600 nm to 700 nm for instance.

In the DBR multi-layer film 6, the circular high resistance region 12 is formed. An inside shape of the high resistance region 12, while depicted as a prism in FIG. 6A, may be formed in cylinder. The high resistance region 12 may be formed by selectively implanting ions such as protons or the like into the region for instance. From a region surrounded by the high resistance region 12, in an upward direction in the drawing, laser light is exited.

The disposition of the high resistance region 12 enables to block and confine the current 16 supplied from the transparent electrode 61 at the portion of the high resistance region 12. In addition, since the transparent electrode 61 is formed over an entire surface of the DBR multi-layer film 6, the current may be efficiently injected into the active layer 4. Thereby, the light emission efficiency may be improved and the threshold current may be lowered.

In the aforementioned embodiment, the method where the high resistance region 12 is formed inside the multi-layer film 6 is explained. However, the high resistance region 12 may be additionally disposed inside of the clad layer 5, thereby the current being further blocked and confined.

Figure 7B:
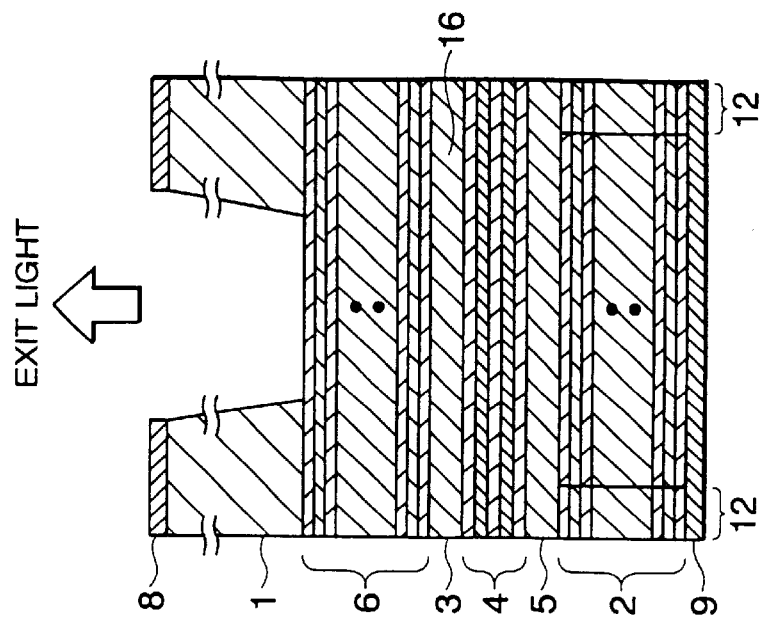
FIG. 7B is a sectional view cut along an A-B profile of FIG. 7A.
Figure 7A:
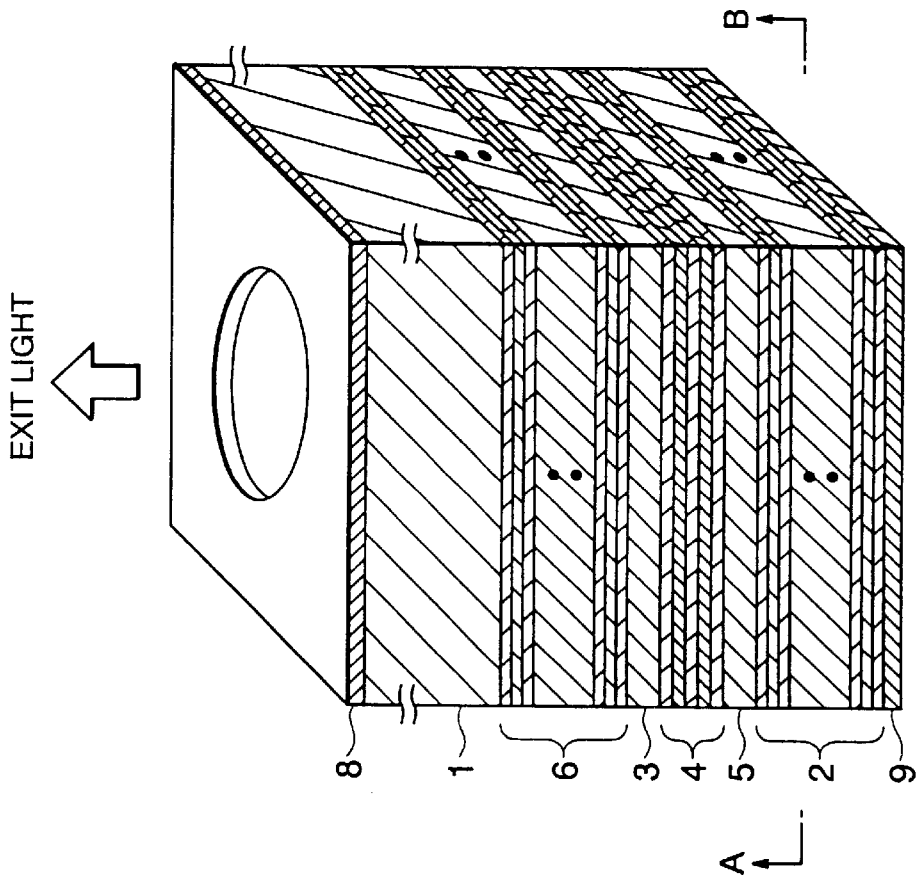
FIG. 7A is a perspective view showing a configuration of a surface emitting semiconductor laser involving a sixth embodiment of the present invention.

FIG. 7A is a perspective view showing a configuration of a surface emitting semiconductor laser involving the sixth embodiment of the present invention; FIG. 7B being a sectional view cut along an A-B profile of FIG. 7A. In FIGS. 7A and 7B, on the DBR multi-layer film 2 the p-side electrode 9 is formed, on the back side of the substrate 1 an n-side electrode 8 being fanned.

In the DBR multi-layer film 2, the high resistance region 12 such as explained in the third and sixth embodiments is formed to block and confine the current injected from the p-side electrode 9. In the n-side electrode 8 and the substrate 1, a disc-like opening is formed to form the light exit window for taking out emitted light. By selectively etching out the n-side electrode 8 and the substrate 1 with the photoresist formed by means or photolithography as a mask, the light exit window may be formed.

In the present embodiment, the current to the active layer 4 supplied from the p-side electrode 9 may be blocked due to the high resistance region 12. Thereby, the light emission efficiency may be improved, and the threshold current is lowered. In addition to the above, since the p-side electrode 9 side is used for mounting, a distance between the active layer 4 and the mounting face becomes shorter to be excellent in heat dissipation characteristics. Accordingly, the temperature characteristics may be improved.

In the aforementioned embodiment, the high resistance region 12 is formed inside of the DBR multi-layer film 2. However, the high resistance region 12 may be additionally formed inside of the clad layer 5, thereby the current being further blocked and confined.

Figure 8A:
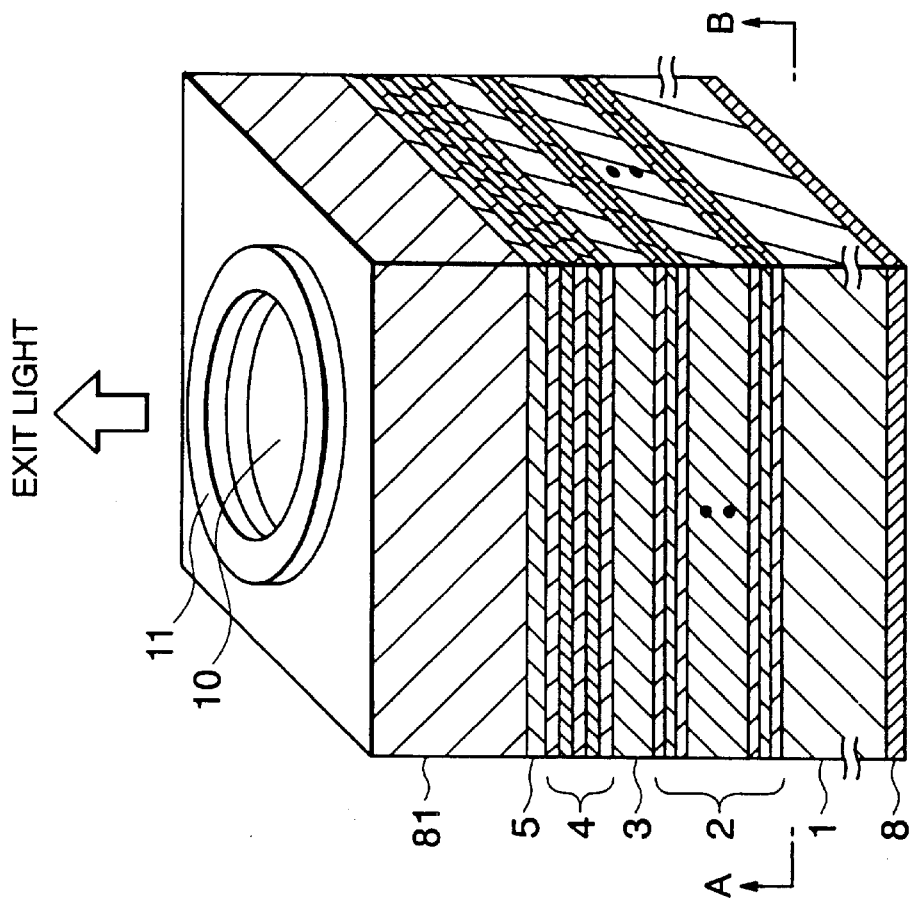
FIG. 8A is a perspective view showing a configuration of a surface emitting semiconductor laser involving a seventh embodiment of the present invention.
Figure 8B:
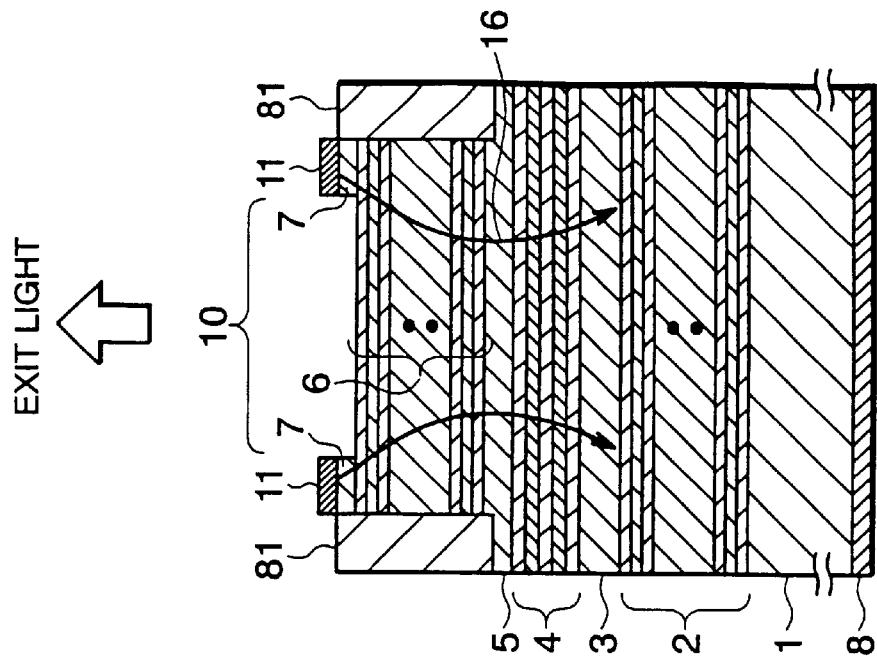
FIG. 8B is a sectional view cut along an A-B profile of FIG. 8A.

FIG. 8A is a perspective view showing a configuration of a surface emitting semiconductor laser involving the seventh embodiment of the present invention; FIG. 8B is a sectional view cut along an A-B profile of FIG. 8A. In FIGS. 8A and 8B, on the p-GaAs cap layer 7 the p-side ring electrode 11 is formed, and by removing the p-GaAs cap layer 7 inside of the p-side ring electrode 11 the light exit window 10 is formed.

Furthermore, outside of the p-side ring electrode 11, extending to part of the clad layer 5 an n-type buried layer 81 is formed. The n-type buried layer 81 may be formed in the following way, for instance. That is, the outside of the p-side ring electrode 11 is selectively etched extending to the part of the clad layer 5 to form a recess, in the recess an n-semiconductor layer whose refractive index is lower than that of the clad layer 5 being regrown.

By disposing the n-type buried layer 81, the current 16 supplied from the p-side ring electrode 11 may be blocked and confined at the n-type buried layer 81, thereby light emission efficiency being improved, the threshold current being lowered.

Figure 9A:
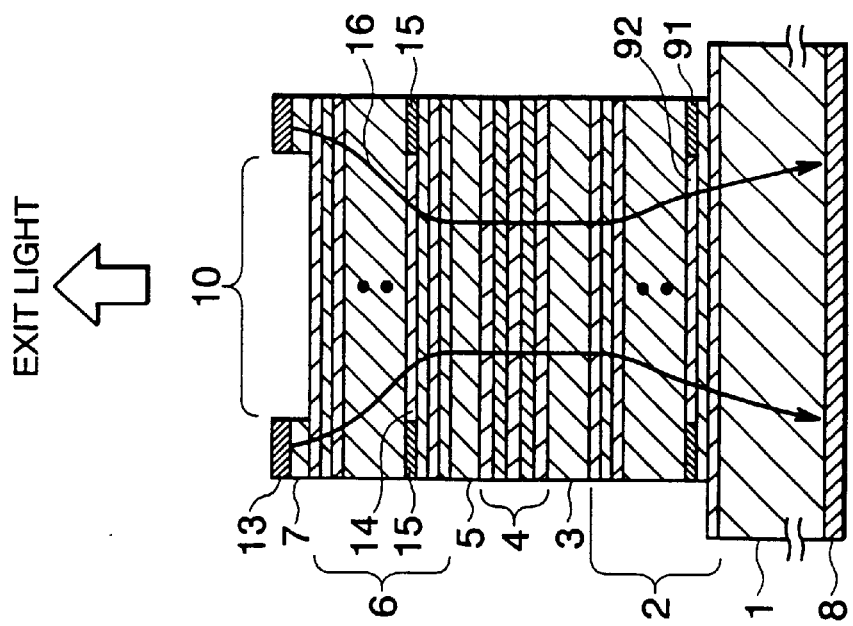
FIG. 9A is a perspective view showing a configuration of a surface emitting semiconductor laser involving an eighth embodiment of the present invention.
Figure 9B:
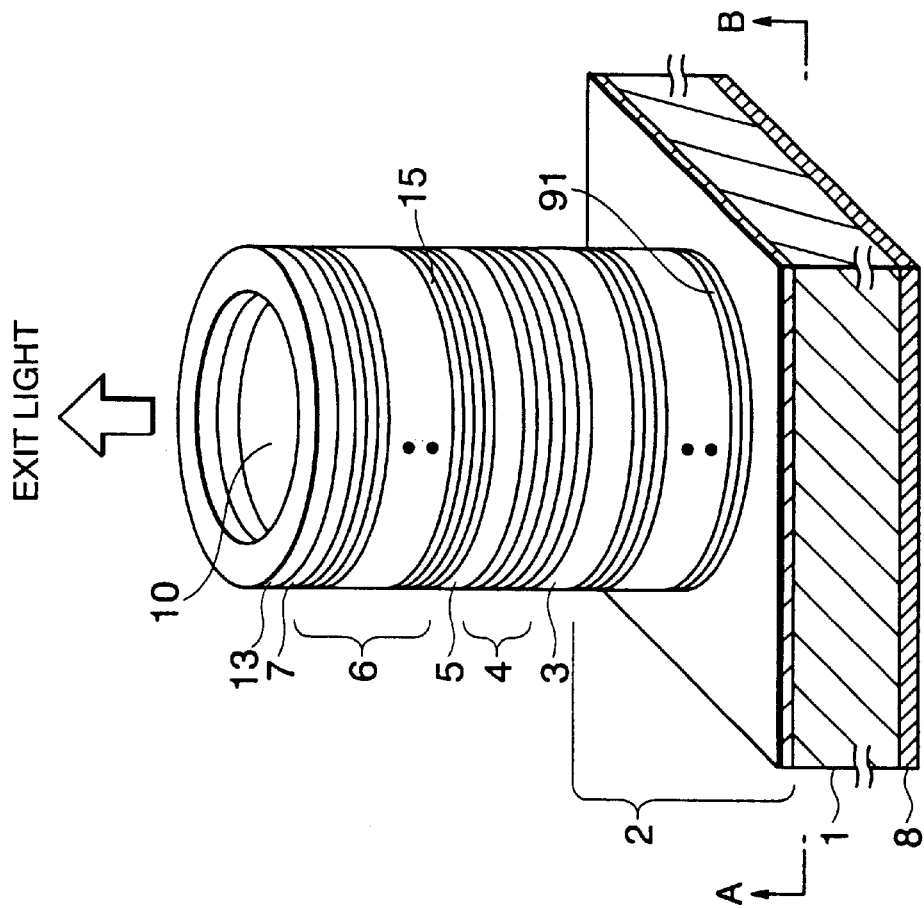
FIG. 9B is a sectional view cut along an A-B prolile of FIG. 9A.
Figure 10C:
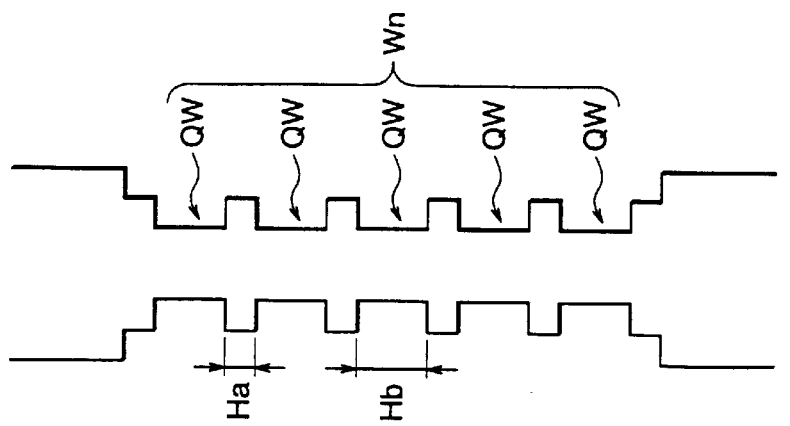
FIG. 10C is an energy band diagram of the active layer and clad layers shown in FIG. 10B.
Figure 10B:
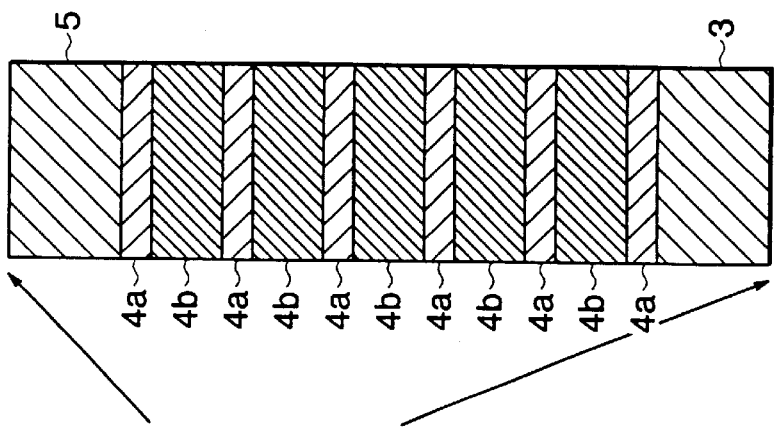
FIG. 10B is an enlargement of a portion of the active layer and the clad layers shown in FIG. 10A.
Figure 10A:
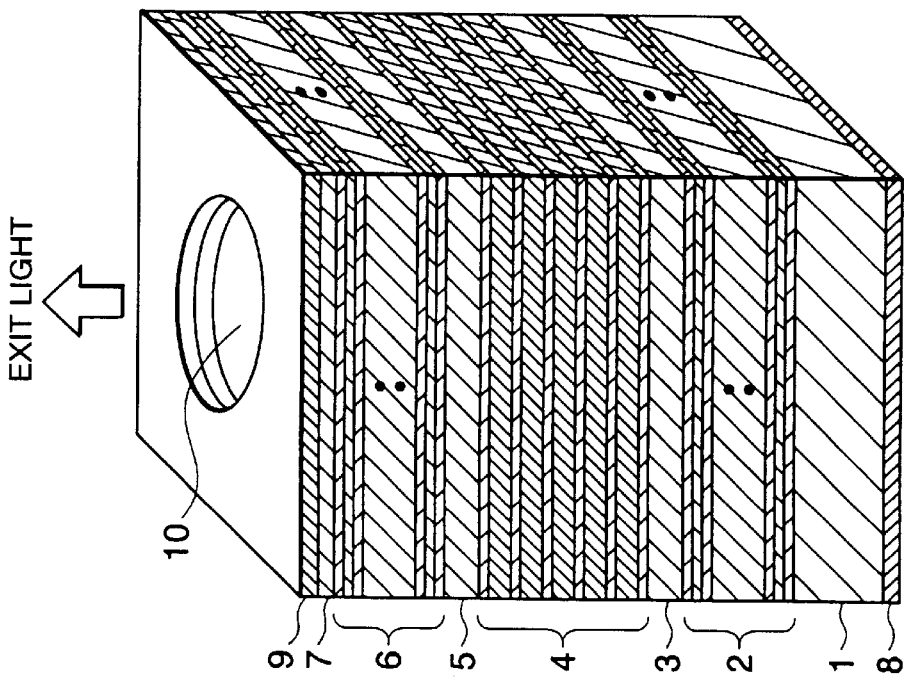
FIG. 10A is a perspective view showing a configuration of an existing surface emitting semiconductor laser.

FIG. 9A is a perspective view showing a configuration of a surface emitting semiconductor laser involving the eighth embodiment of the present invention; FIG. 9B is a sectional view cut along an A-B profile of FIG. 9A. In FIGS. 9A and 9B, the p-GaAs cap layer 7, the DBR multi-layer film 6, the clad layer 5, the active layer 4, the clad layer 3, and almost all of the DBR multi-layer film 2 are cylindrically etched to form. On the p-GaAs cap layer 7, the p-side ring electrode 13 is formed and, by removing the p-GaAs cap layer 7 inside of the p-side ring electrode 13 the light exit window 10 is formed. Instead of the aforementioned cylindrical etching, the p-side ring electrode 13 may be formed in rectangle and prismatic etching may be implemented.

On the DBR multi-layer films 6 and 2, one or a plurality of AlAs layers 14 and 92 is formed, respectively. The AlAs layers 14 and 92 are exposed to an oxidizing atmosphere to oxidize the periphery thereof 14 and 92, thereby forming selectively oxidized ring regions 15 and 91 inside of the DBR multi-layer films 6 and 2.

By disposing the selectively oxidized regions 15 and 91, the current 16 supplied from the p-side ring electrode 13 may be blocked and confined by the selectively oxidized region 15, and the current flowing from the active layer 4 to the n-side electrode 8 may be blocked and confined by the selectively oxidized region 91. Thereby, the light emission efficiency may be further improved, and the threshold current may be further lowered.

The AlAs layers 14 and 92 may be an InAs layer.

In the above embodiments each, cases where the DBR multi-layer 6 is formed of compound semiconductors are explained for illustration purpose. However, other than this, with dielectrics for instance, the DBR multi-layer film of the similar function may be formed. In that case, dielectrics of high refractive index and low refractive index are alternately stacked. For the dielectrics, $SiO_2$, $SiN_x$, amorphous Si, alumina and so on may be used.

In the above embodiments each, the surface emitting semiconductor lasers with the n-GaAs substrate 1 are explained. However, the conduction type may be an opposite one.

It is understood that the invention is not confined to the particular implementation modes set forth herein as illustrative, but embraces all such modified forms thereof as come within the scope of the following claims.

What is claimed is:

1. A surface emitting semiconductor laser comprising:
   an active layer having an InGaP/InGaAlP quantum well structure of which well width is from 4 nm to 6 nm and number of wells is one or two;
   InGaAlP clad layers formed above and below the active layer; and
   light reflecting layers that are stacked, in a stacking direction of the active layer, through the above and below clad layers each, further above and below the clad layers, wherein the light reflecting layer each being a DBR multi-layer film in which a $Ga_{1-x}Al_xAs$ film (herein $0.9 \geq x \geq 0.5$) and a $Ga_{1-y}Al_yAs$ film (herein $y \geq 0.9$) are alternately stacked.

2. A surface emitting semiconductor laser as set forth in claim 1:
   wherein an exit window of laser light outputted transmitting through one of the above and below light reflecting layers is formed in array on a substrate.

3. A surface emitting semiconductor laser as set forth in claim 1:
   wherein the DBR multi-layer film includes a circular high resistance region.

4. A surface emitting semiconductor laser as set forth in claim 3, further comprising:
   an electrode layer, on a side different from a clad layer side of one of the light reflecting layers that are the DBR multi-layer films, that transmits output laser light.

5. A surface emitting semiconductor laser as set forth in claim 3, further comprising:
   a substrate on a side different from a clad layer side of one of the light reflecting layers that are the DBR multi-layer films, the substrate being hollowed to form a light exit window.

6. A surface emitting semiconductor laser as set forth in claim 1;
   wherein the DBR multi-layer film includes an AlAs layer therein, the AlAs layer being circularly surrounded by an oxide region of AlAs.

7. A surface emitting semiconductor laser as set forth in claim 1:
   wherein one of the DBR multi-layer films is circularly surrounded by a buried layer.

8. A surface emitting semiconductor laser as set forth in claim 1:
   wherein the above and below DBR multi-layer films each that are the above and below light reflecting layers include an AlAs layer therein, the AlAs layer being circularly surrounded by an oxide region of AlAs.

9. A surface emitting semiconductor laser as set forth in claim 1:
   wherein the above and below DBR multi-layer films each that are the above and below light reflecting layers include an InAs layer therein, the InAs layer being circularly surrounded by an oxide region of InAs.

10. A surface emitting semiconductor laser comprising:
    an active layer having an InGaP/InGaAlP quantum well structure of which well width is from 4 nm to 6 nm and number of wells is one or two;
    InGaAlP clad layers formed above and below the active layer; and
    light reflecting layers that are stacked, in a stacking direction of the active layer, through the above and below clad layers each, further above and below the clad layers, wherein the light reflecting layer each is a DBR multi-layer film in which an $In_{0.5}(Ga_{1-x}Al_x)_{0.5}P$ film (herein $x \leq 0.5$) and an $In_{0.5}(Ga_{1-y}Al_y)_{0.5}P$ film (herein $y \geq 0.9$) are alternately stacked.

11. A surface emitting semiconductor laser as set forth in claim 10:
    wherein the DBR multi-layer film includes a circular high resistance region.

12. A surface emitting semiconductor laser as set forth in claim 11, further comprising:
    an electrode layer, on a side different from a clad layer side of one of the light reflecting layers that are the DBR multi-layer films, that transmits output laser light.

13. A surface emitting semiconductor laser as set forth in claim 11, further comprising:
    a substrate on a side different from a clad layer side of one of the light reflecting layers hat are the DBR multi-14yer films, the substrate being hollowed to form a light exit window.

14. A surface emitting semiconductor laser as set forth in claim 10:
    wherein the DBR multi-layer film includes an AlAs layer therein, the AlAs layer being circularly surrounded by an oxide region of AlAs.

15. A surface emitting semiconductor laser as set forth in claim 10:
    wherein one of the DBR multi-layer films is circularly surrounded by a buried layer.

16. A surface emitting semiconductor laser as set forth in claim 10:
    wherein the above and below DBR multi-layer films each that are the above and below light reflecting layers include an AlAs layer therein, the AlAs layer being circularly surrounded by an oxide region of AlAs.

17. A surface emitting semiconductor laser as set forth in claim 10:
wherein the above and below DBR multi-layer films each that are the above and below light reflecting layers include an InAs layer therein, the InAs layer being circularly surrounded by an oxide region of InAs.

18. A surface emitting semiconductor laser as set forth in claim 10:
    wherein an exit window of laser light outputted transmitting through one of the above and below light reflecting layers is formed in array on a substrate.

* * * * *